United States Patent [19]

Reay et al.

[11] Patent Number: 5,714,955
[45] Date of Patent: Feb. 3, 1998

[54] ANALOG-TO-DIGITAL CONVERTER

[75] Inventors: Robert L. Reay, Mountain View, Calif.; Yang-Long Teo, Singapore, Singapore; William C. Rempfer, San Jose, Calif.

[73] Assignee: Linear Technology Corporation, Milpitas, Calif.

[21] Appl. No.: 486,862

[22] Filed: Jun. 7, 1995

[51] Int. Cl.⁶ .................................................. H03M 1/12
[52] U.S. Cl. .......................... 341/155; 341/126; 341/141
[58] Field of Search ................................ 341/155, 141, 341/126

[56] References Cited

U.S. PATENT DOCUMENTS

| | | | |
|---|---|---|---|
| 4,045,719 | 8/1977 | Salzer | 363/89 |
| 5,287,525 | 2/1994 | Lum et al. | |
| 5,420,798 | 5/1995 | Lin et al. | 364/483 |
| 5,543,795 | 8/1996 | Fernald | 341/163 |
| 5,557,274 | 9/1996 | Hirooka et al. | 341/155 |

*Primary Examiner*—Jeffrey A. Gaffin
*Assistant Examiner*—Jason L. W. Kost
*Attorney, Agent, or Firm*—Fish & Neave; Robert W. Morris

[57] ABSTRACT

Serial analog-to-digital converters (ADC) in which power down and power up modes are activated by two dual-purpose input signals are provided. The ADCs of the invention eliminate the need for a dedicated power down input line as found on typical serial ADCs. When commanded to do so, the ADC enters into one of two power down modes, NAP or SLEEP. In NAP mode, only those portions of the ADC circuit which consume current and which are capable of waking up almost instantaneously are powered down. In SLEEP mode, the entire ADC circuit is powered down. When commanded to do so, the ADC enters into a power up mode, applying current to every portion of the ADC circuit. Wake-up from the NAP mode takes place almost instantaneously. Wake-up from the SLEEP mode requires additional time. From either mode, a signal is generated when the ADC conversion circuit, which preferably includes a reference voltage generator, has stabilized sufficiently for the ADC to perform analog-to-digital conversion.

33 Claims, 7 Drawing Sheets

5,714,955

ANALOG-TO-DIGITAL CONVERTER

BACKGROUND OF THE INVENTION

This invention relates to data converters. More particularly, the invention relates to serial analog-to-digital converters (ADCs) where, in one aspect, powering down and powering up the ADC is performed using two dual-purpose input signals, and in another aspect, the ADC provides a ready signal indicating that the ADC has sufficiently stabilized so that the ADC may adequately perform analog-to-digital conversion. The ready signal preferably indicates that the reference voltage generator is at the proper reference voltage for accurate conversion.

Conventional ADC circuits typically use a dedicated input in order to implement the power down function. Application of a signal to this input commands the integrated circuit to power down the ADC circuit. This power down function allows a user to reduce power consumption by shutting down the ADC circuit when it is not needed. The power down signal to the dedicated input on the ADC must be negated before the user can perform analog-to-digital conversion operations with that circuit. A dedicated input for a stand-alone converter requires an additional input pin, thereby increasing the number of pins in the chip package. A dedicated input for a converter embedded in an integrated circuit requires an extra interface to non-converter circuitry, thereby increasing the space occupied by the integrated circuit and the complexity of the integrated circuit layout.

Additionally, once the power down signal is negated, the ADC circuit only begins to wake up. It is not instantaneously responsive. Furthermore, the wake-up process is typically of an unknown length of time, even varying for the same circuit manufactured on different circuit boards (i.e., even if all of the circuitry is substantially identical between two circuit boards, the wake-up time may still vary due to manufacturing variables). The user must wait for an unknown length of time before the circuit is ready for conversion. This wait may be attributed to the powering up of various ADC subblocks, particularly the reference voltage subblock. The length of this wake-up time is a function of the circuit wake-up time constant and the loading condition of the circuit. The user must take into account the worst case time constant before instructing the ADC circuit to begin performing a data conversion operation, resulting in unnecessary delay.

SUMMARY OF THE INVENTION

In view of the foregoing, it is an object of the present invention to provide a data converter which generates power down and power up commands using existing input signals to reduce the need for dedicated inputs.

It is another object of the present invention to provide a data converter having two power down modes: NAP for intermediate power conservation and SLEEP for maximum power conservation.

It is also an object of the present invention to provide a data converter which generates a ready signal to indicate that the data converter circuitry has stabilized sufficiently for the data converter to perform data conversion.

In accordance with these and other objects of the present invention, data converters, and particularly serial ADCs, are described in which two existing input signals are processed to produce power down (both SLEEP and NAP) and power up commands without interfering with the normal functions of these signals. In particular, a CLOCK signal used to synchronize the conversion operation and a CONV signal used to initiate the conversion operation also serve to produce power down and power up commands. When CLOCK is low, two CONV pulses command the ADC to enter NAP mode. When CLOCK remains low, two additional CONV pulses command the ADC to enter SLEEP mode.

Also described is circuitry which generates a REFRDY signal to indicate that the reference voltage circuitry has stabilized. Once the reference voltage circuitry has stabilized (i.e., the reference voltage is properly set), the ADC is ready to perform data conversion operations. In this manner, the user does not have to wait for the worst-case start-up time before performing conversion operations.

BRIEF DESCRIPTION OF THE DRAWINGS

The above and other objects of the present invention will be apparent upon consideration of the following detailed description, taken in conjunction with the accompanying drawings, in which like reference characters refer to like parts throughout, and in which.

DETAILED DESCRIPTION OF THE INVENTION

Typical serial analog-to-digital converters (ADCs) utilize a signal such as CONV (Start Conversion) to initiate analog-to-digital data conversion operations. Once triggered by a CONV signal, a conventional serial ADC then utilizes a sequence of pulses from a CLOCK signal to synchronize the conversion operation. The resultant serial digital data produced is output as a signal called DOUT.

Figure 1:
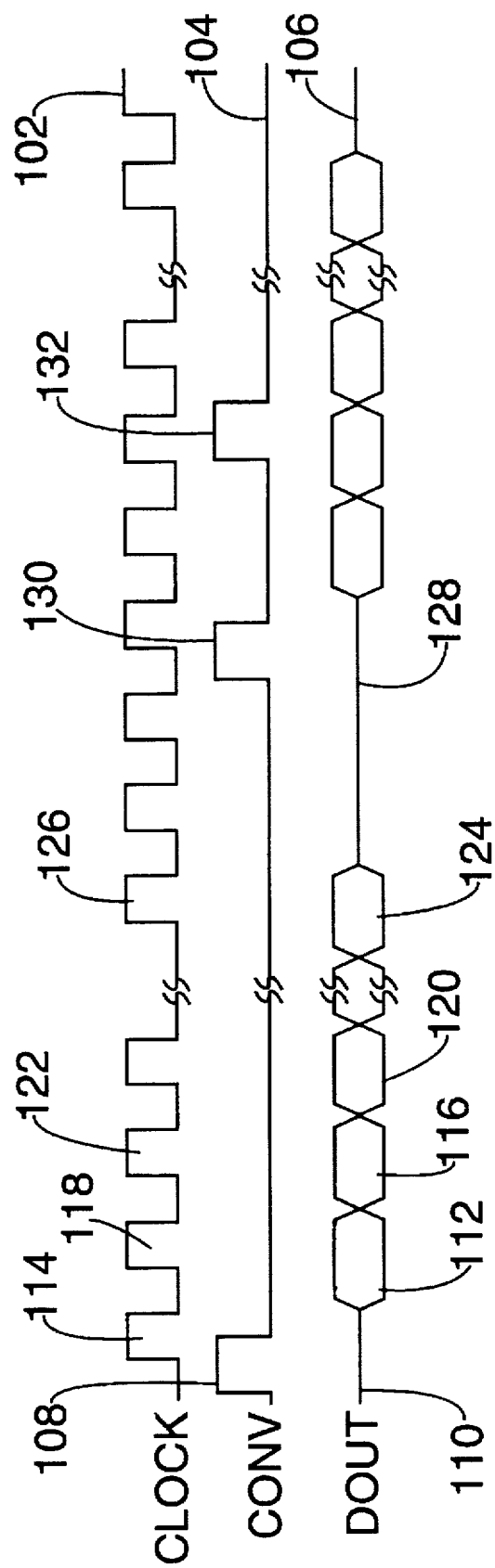
FIG. 1 is a graph showing a typical serial ADC outputting data with respect to time.

FIG. 1 is a graph showing CLOCK 102, CONV 104, and DOUT 106 signals for a typical serial ADC (not shown). As shown, the conversion operation begins after CONV pulse 108 occurs while the conversion circuit is in a wait state as indicated by signal 110 on trace DOUT 106. A dummy bit appears as DOUT 112 in response to the downward edge of first CLOCK pulse 114 after CONV pulse 108 occurs. The dummy bit provides a one clock cycle delay while the converter determines the value of the most signficant bit (MSB) of the digital output word. Thus, the dummy bit may be either a "1" or a "0." By the end of the first clock cycle, the MSB is known and the conversion process may continue. The MSB appears as DOUT pulse 116 after the downward edge of CLOCK pulse 118. The second most significant bit appears as DOUT pulse 120 after the downward edge of CLOCK pulse 122. Each additional bit of the output word is produced in this manner on trace DOUT 106 until the least significant bit is produced as DOUT pulse 124. If the output word has N bits, the production of the least significant bit occurs after N+1 CLOCK pulses. The conversion operation is completed with the downward edge of CLOCK pulse 126, which follows CLOCK pulse N+1 (not shown). The output returns to its wait-state value as shown by signal 128 on trace DOUT 106.

Any CONV pulse which occurs after the conversion operation is complete reinitiates the conversion operation for a new input value as shown in FIG. 1 by the response on trace DOUT 106 to CONV pulse 130. However, CONV pulses appearing during an ongoing conversion operation have no effect upon the circuit, as shown in FIG. 1 by the lack of a response on trace DOUT 106 to CONV pulse 132.

In accordance with the principles of the present invention, the CONV input signal and the CLOCK input signal may also serve an additional function. These dual-purpose input signals may also be used to generate power down (both NAP and SLEEP, as is described below) and power up functions. Providing the power down functions using existing input signals eliminates the requirement for an additional dedicated input to power down the circuit as is found on typical serial ADCs.

Figure 2:
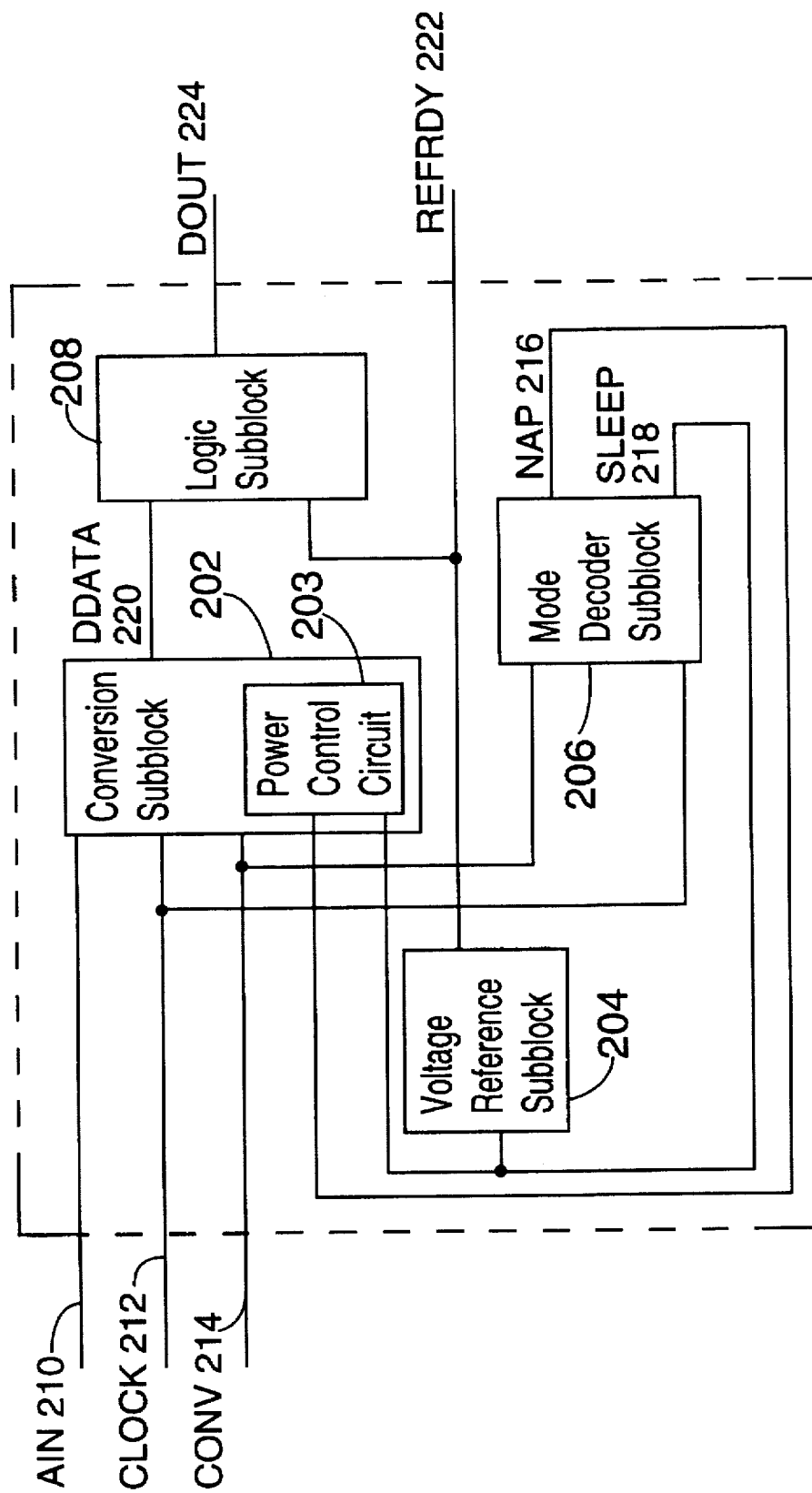
FIG. 2 is a top level schematic block diagram of an ADC in accordance with the principles of the present invention.

FIG. 2 shows a top level schematic block diagram of an ADC in accordance with the principles of the present invention. ADC 200 contains a conversion subblock 202 with a power control circuit 203 contained therein, a voltage reference subblock 204, a mode decoder subblock 206, and a logic subblock 208. In brief, conversion subblock 202 performs the data conversion operation. Power control circuit 203 selectively applies or removes power to selected components. Voltage reference subblock 204 generates a reference voltage and ready signal indicating that the ADC has sufficiently stabilized to perform data conversion operations. Mode decoder subblock 206 provides the power down and power up functions. Logic subblock 208 processes the data generated by conversion subblock 202 and the ready signal generated by voltage reference subblock 204 for output as a serial digital data bitstream.

There may be at least three input signals to ADC 200. AIN 210 is an analog input signal representing analog data to be converted into digital data. CLOCK 212 and CONV 214 are dual-purpose digital input signals. Conversion subblock 202 utilizes CLOCK 212 and CONV 214 to time and initiate data conversion operations, respectively, as described more fully below. The mode decoder subblock 206 utilizes CLOCK 212 and CONV 214 to generate the power down and power up functions, as described in more detail below. CLOCK signal 212 consists of a series of timing pulses during the conversion operation and consists of a low logic signal during the power down modes.

ADC 200 also has at least four internal signals. NAP 216 is a digital signal which commands power control circuit 203 to selectively apply or remove power to selected components. SLEEP 218 is a digital signal which commands power control circuit 203 and voltage reference subblock 204 to selectively apply or remove power to all components in ADC 200. DDATA 220 represents digital data generated by conversion subblock 202, which is passed to logic subblock 208. REFRDY 222 is a digital signal generated by voltage reference subblock 204 indicating that the ADC has sufficiently stabilized to accurately perform analog-to-digital conversion. REFRDY 222 may be passed on to logic subblock 208 or to external circuitry.

ADC 200 also has at least one output signal. DOUT 224 is output by logic subblock 208 as a serial digital data bitstream of N+1 bits. This bitstream may also contain a REFRDY 222 bit instead of the dummy bit previously described. REFRDY 222 is produced by voltage reference subblock 204 followed by a number (N) of DDATA 220 bits produced by conversion subblock 202. Alternatively, REFRDY 222 may be output directly by voltage reference subblock 204 rather than being inserted in the serial digital data bitstream of DOUT, in which case the dummy bit is still used.

Figure 3:
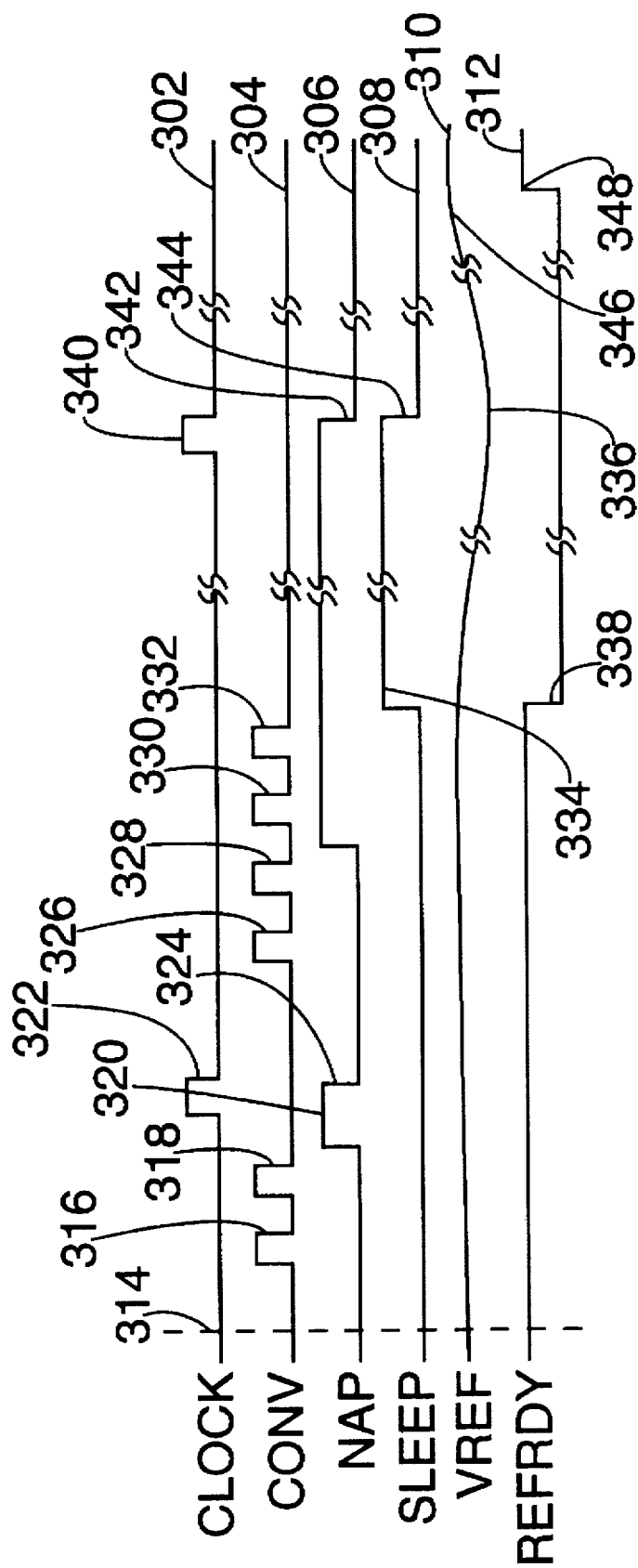
FIG. 3 is a graph showing various signals of an ADC in accordance with the principles of the present invention during various operational states, all shown with respect to time.

A graph showing various representative signals for an ADC in accordance with the principles of the present invention is shown in FIG. 3. FIG. 3 shows signals CLOCK 302, CONV 304, NAP 306, SLEEP 308, VREF 310, and REFRDY 312, all with respect to time. As indicated at time 314, CLOCK 302, CONV 304, NAP 306, and SLEEP 308 are all low, while REFRDY 312 is high. VREF 310, the only analog signal shown in FIG. 3, is stable and at the proper voltage for accurate analog-to-digital conversion at time 314. The state of the ADC (not shown) at time 314 is Power Up mode, where the ADC is ready to perform data conversion upon request.

In accordance with the principles of the present invention, the ADC changes modes through the use of selected sequences of existing signals. For example, when two CONV pulses 316 and 318 occur while CLOCK 302 is low, the ADC sets NAP 306 high to indicate a NAP mode request as is shown by NAP pulse 320. This commands the ADC circuitry to enter into NAP mode. In NAP mode, all of the subblocks in the ADC that consume current and are able to wake up virtually instantaneously (i.e., without a time delay that would affect a conversion operation) are powered down. The reference voltage subblock in particular, however, continues to receive power because it requires time to be powered up. Thus, VREF 310 remains stable at the correct reference voltage for analog-to-digital conversion and REFRDY 312 remains high.

CLOCK 302 is kept low so long as the NAP mode is desired. When CLOCK pulse 322 occurs, NAP 306 goes low, as shown by downward edge 324. Power is then restored to those portions of the ADC which were powered down earlier. VREF 310 and REFRDY 312 both remain unchanged as the ADC circuit "wakes up" essentially immediately. Thus, in NAP mode, the ADC circuit is ready to commence analog-to-digital conversion operations essentially immediately because the time required to power up the powered down components is inconsequential in relation to the time for conversion operations.

When four CONV pulses 326, 328, 330, and 332 occur while CLOCK 302 is low, the ADC sets SLEEP 308 high to indicate a SLEEP mode request as shown by SLEEP pulse 334. This commands the ADC circuitry to enter into SLEEP mode. In SLEEP mode, all of the subblocks in the ADC that consume current are powered down, including the voltage reference subblock. Thus, VREF 310 slowly drops until VREF 310 reaches GND, as shown at VREF 336. REFRDY 312 goes low at REFRDY 338, indicating that VREF 310 is insufficiently stable for accurate analog-to-digital conversion (the generation of the REFRDY signal is described in detail with respect to the circuit shown in FIG. 5 below).

It should be noted that NAP 306 goes high after the second CONV pulse at CONV 328, and remains high after CONV pulse 330 and CONV pulse 332. Thus, NAP 306 and SLEEP 308 are high during SLEEP mode, while only NAP 306 is high during NAP mode.

CLOCK 302 is kept low so long as the SLEEP mode is desired. When CLOCK pulse 340 occurs during SLEEP mode, both NAP 306 and SLEEP 308 go low, as shown by NAP pulse 342 and SLEEP pulse 344, respectively. Power is then restored to all portions of the ADC. However, certain parts of the ADC circuit, the voltage reference generator in particular, do not wake up immediately: signal VREF 310 slowly charges up from GND. When VREF 310 has stabilized sufficiently for accurate analog-to-digital conversion, as shown by VREF 346, REFRDY 312 goes high, as shown by REFRDY 348. Thus, upon exiting SLEEP mode, the ADC circuit is not immediately ready to commence analog-to-digital conversion operations. However, due to the implementation of NAP and SLEEP modes, and the generation of the REFRDY signal, the ADC of the present invention may begin conversion operations as soon as the circuitry is ready, rather than waiting for the worst-case start-up time to expire.

Table 1 summarizes the state of the NAP signal and the SLEEP signal during Power Up mode, NAP mode, and SLEEP mode:

TABLE 1

| Mode | NAP | SLEEP |
| --- | --- | --- |
| Power Up | Low | Low |
| NAP Mode | High | Low |
| SLEEP Mode | High | High |

Figure 4:
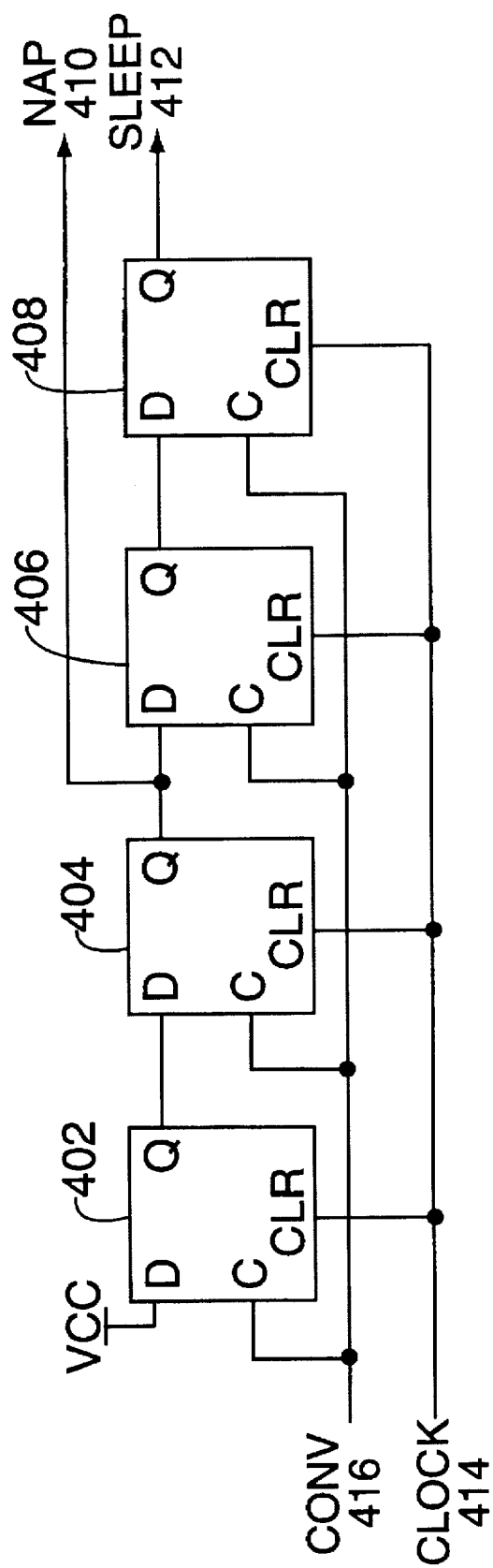
FIG. 4 is a simplified schematic diagram of one embodiment of the mode decoder in accordance with the principles of the present invention.

FIG. 4 shows a simplified schematic of one embodiment of the mode decoder subblock 206 of FIG. 2. The circuitry of subblock 206 is responsible for issuing sleep and wake-up commands to the remaining circuits. As shown, subblock 206 consists of four type D flip-flops 402, 404, 406, and 408. The NAP signal 410 is taken from the Q output of flip-flop 404 and the SLEEP signal 412 is taken from the Q output of flip-flop 408.

The CLOCK signal 414 goes to the CLR input on each of the four flip-flops 402, 404, 406, and 408. The CONV signal 416 goes to the C input on each of the four flip-flops 402, 404, 406, and 408. When a high signal is applied to the CLR inputs of each flip-flop, the Q outputs of each of flip-flops 402, 404, 406, and 408 are cleared. Thus, when CLOCK 414 goes high, both NAP 410 and SLEEP 412 are set low. When CLOCK 414 returns to low, both NAP 410 and SLEEP 412 remain low.

The D input of flip-flop 402 is set high by being tied to Vcc. The Q output of flip-flop 402 is coupled to the D input of flip-flop 404. The Q output of flip-flop 404 generates the NAP 410 signal. The Q output of flip-flop 404 is coupled to the D input of flip-flop 406. The Q output of flip-flop 406 is coupled to the D input of flip-flop 408. The Q output of flip-flop 408 generates the SLEEP 412 signal.

As is standard with downward edge-triggered flip-flops, on the downward edge of a CONV 416 pulse, data present at the D input of each individual flip-flop is transferred to the Q output of that individual flip-flop. Thus, when CLOCK 414 is set low, two consecutive CONV 416 pulses result in the following sequence of events: (1) On the downward edge of the first CONV 416 pulse, the Q output of flip-flop 402 is set high because the D input of flip-flop 402 prior to the CONV 416 pulse was set high by being tied to Vcc. Because the D inputs of the remaining flip-flops 404, 406, and 408 were low before the CONV 416 pulse, the Q outputs of the remaining flip-flops 404, 406, and 408 all remain unchanged at low; (2) On the downward edge of the second CONV 416 pulse, the Q output of flip-flop 404 is set high because the D input of flip-flop 404 (coming from the Q output of flip-flop 402) was high prior to the second CONV 416 pulse. The Q outputs of flip-flops 402, 406, and 408 remain unchanged at high, low, and low, respectively; (3) The NAP signal 410 (taken from the Q output of flip-flop 404) is now high.

While CLOCK 414 remains set at low, two additional consecutive CONV 416 pulses result in the following sequence of events: (1) On the downward edge of the third CONV 416 pulse, the Q output of flip-flop 406 is set high because the D input of flip-flop 406 (coming from the Q output of flip-flop 404) was high prior to the third CONV 416 pulse. The Q outputs of flip-flops 402, 404, and 408 remain unchanged at high, high, and low, respectively; (2) On the downward edge of the fourth CONV 416 pulse, the Q output of flip-flop 408 is set high because the D input of flip-flop 408 (coming from the Q output of flip-flop 406) was high prior to the fourth CONV 416 pulse. The Q output of flips flops 402, 404, and 406 all remain unchanged at high; (3) The SLEEP 412 signal (taken from the Q output of flip-flop 408) is now high.

As long as CLOCK 414 remains low, additional CONV 416 pulses after the fourth consecutive CONV 416 pulse have no effect because Vcc is continuously applied to the D input of flip-flop 402 which, in turn, continues to pass Vcc in sequence to flip-flops 404, 406, and 408. Therefore, the Q outputs of all four flip-flops 402, 404, 406, and 408 remain high, as do both the NAP signal 410 and the SLEEP signal 412.

If CLOCK 414 goes high at any time, the Q outputs of all four flip-flops 402, 404, 406, and 408 are all set low, which also set NAP signal 410 and SLEEP signal 412 low.

Figure 5:
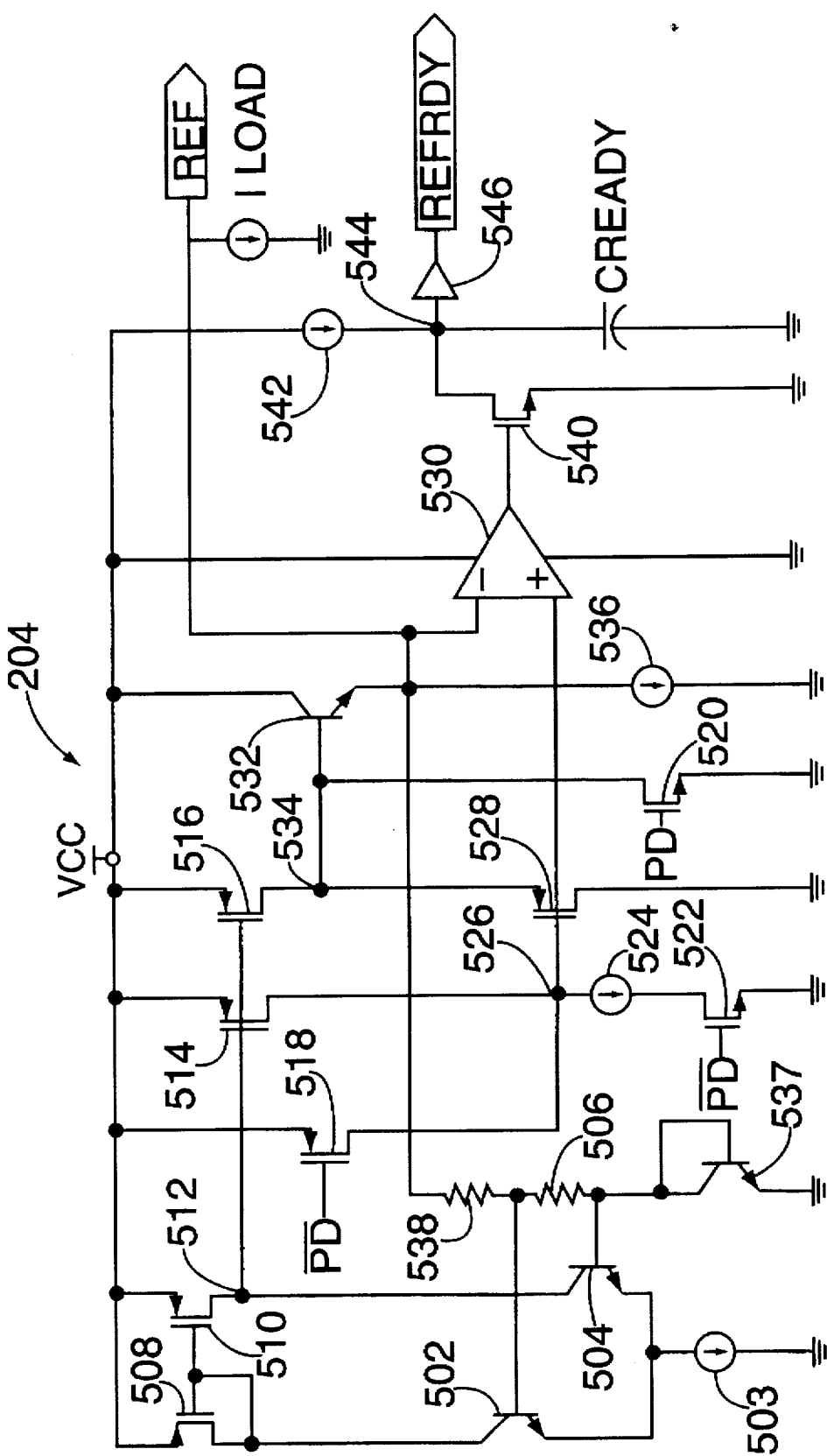
FIG. 5 is a detailed schematic diagram of a voltage reference generator circuit and a REFRDY signal circuit in accordance with the principles of the present invention.

FIG. 5 shows a detailed schematic diagram of voltage reference subblock 204 of FIG. 2. Voltage reference subblock 204 includes transistors 502 and 504 (which are preferably bi-polar transistors), that are substantially similar, except that transistor 504 has an emitter area X times larger than the emitter area of transistor 502. The emitter area difference, combined with the voltage drop across resistor 506 (which is coupled between the bases of transistors 502 and 504), establishes that the collector currents of transistors 502 and 504 are substantially equal. The equality of the currents is further reinforced by the current mirror formed by transistors 508 and 510 (which are preferably field-effect transistors or FETs).

The configuration of transistors 502, 504, 508 and 510 establishes a high impedance at node 512 because the current flowing from VCC through transistors 508 and 502 is substantially the same as the current flowing from VCC through transistors 510 and 504. All of this current is substantially sunk by current source 503. The high impedance at node 512 turns on transistors 514 and 516 (which are preferably FETs).

During steady-state conditions, the power down signal (PD) is low, which turns off transistors 518 and 520, and turns on transistor 522 (all three preferably being FETs). The path from VCC through transistors 514 and 522 to ground turns on current source 524 which establishes node 526 at a high impedance and amplifies the voltage at node 512 to a higher voltage at node 526. The high impedance of node 526 turns on transistor 528 (which is preferably a FET) and provides a low input to comparator 530. Additionally, transistors 516, 528, and 532 (where transistor 532 is preferably a bi-polar transistor) provide a voltage follower which level shifts the voltage at node 526 to node 534 (i.e., the voltage at node 534 is essentially equal to the voltage at node 526 plus $V_{GS}$ of transistor 528).

Current source 536 merely establishes a quiescent current for transistor 532, such that it operates substantially in the active region. Thus, the voltage at the emitter of transistor 532 is provided as the voltage to REF. Additionally, the steady-state value of VREF is set by transistor 537 (preferably a bi-polar transistor) and resistors 506 and 538. As the load on the reference voltage changes (as indicated by current source ILOAD), the voltage at REF varies from the value set by transistor 537 and resistors 506 and 538 by changes in the voltage at the collector of transistor 532.

For example, when REF goes slightly low, transistor 504 sinks more current than is provided by transistor 510. The variance in current between transistors 504 and 510 causes node 512 to go low, and nodes 526 and 534 to go high, thereby causing REF to go higher through transistor 532 until a balance is reached (at which point the current through transistors 504 and 510 are again the same).

Additionally, during steady-state conditions, the output of comparator 530 turns transistor 540 (preferably a FET) off. Because transistor 540 is off, current source 542 charges capacitor $C_{READY}$ to establish a voltage at node 544. The voltage at node 544 is provided as the REFRDY signal through a unity-gain buffer 546, which isolates downstream circuitry (not shown) from voltage reference subblock 204.

When a SLEEP command is issued to power down voltage reference subblock 204, PD is set high. This turns on transistors 518 and 520 and turns off transistor 522. Once transistor 518 is turned on, the voltage at node 526 is tied to VCC (because transistor 522 turned off current source 524). The high voltage at node 526 is input to comparator 530, causing comparator 530 to provide an output signal which turns on transistor 540. Once on, transistor 540 discharges capacitor $C_{READY}$, thereby setting REFRDY low. Additionally, transistor 520 is turned on by PD going high, which turns off transistor 532 (its base is now tied to ground through transistor 520) so that REF may no longer pull current through transistor 532.

Once a CLOCK signal is received, PD goes low and, as described above, current source 524 is turned on and transistor 520 is turned off (which turns transistor 532 back on). At that point, the current flowing through transistor 504 is greater than the current through transistor 510. The voltage at node 526 remains high until REF pulls enough current through transistor 532 to establish REF substantially close to the desired value, at which point the impedance at nodes 512 and 526 go high, causing the input to comparator 530 to go low. Once the input to comparator 530 is low, the output to comparator 530 turns off transistor 540, thereby allowing capacitor $C_{READY}$ to once again charge through current source 542 until REFRDY goes high.

Figure 6:
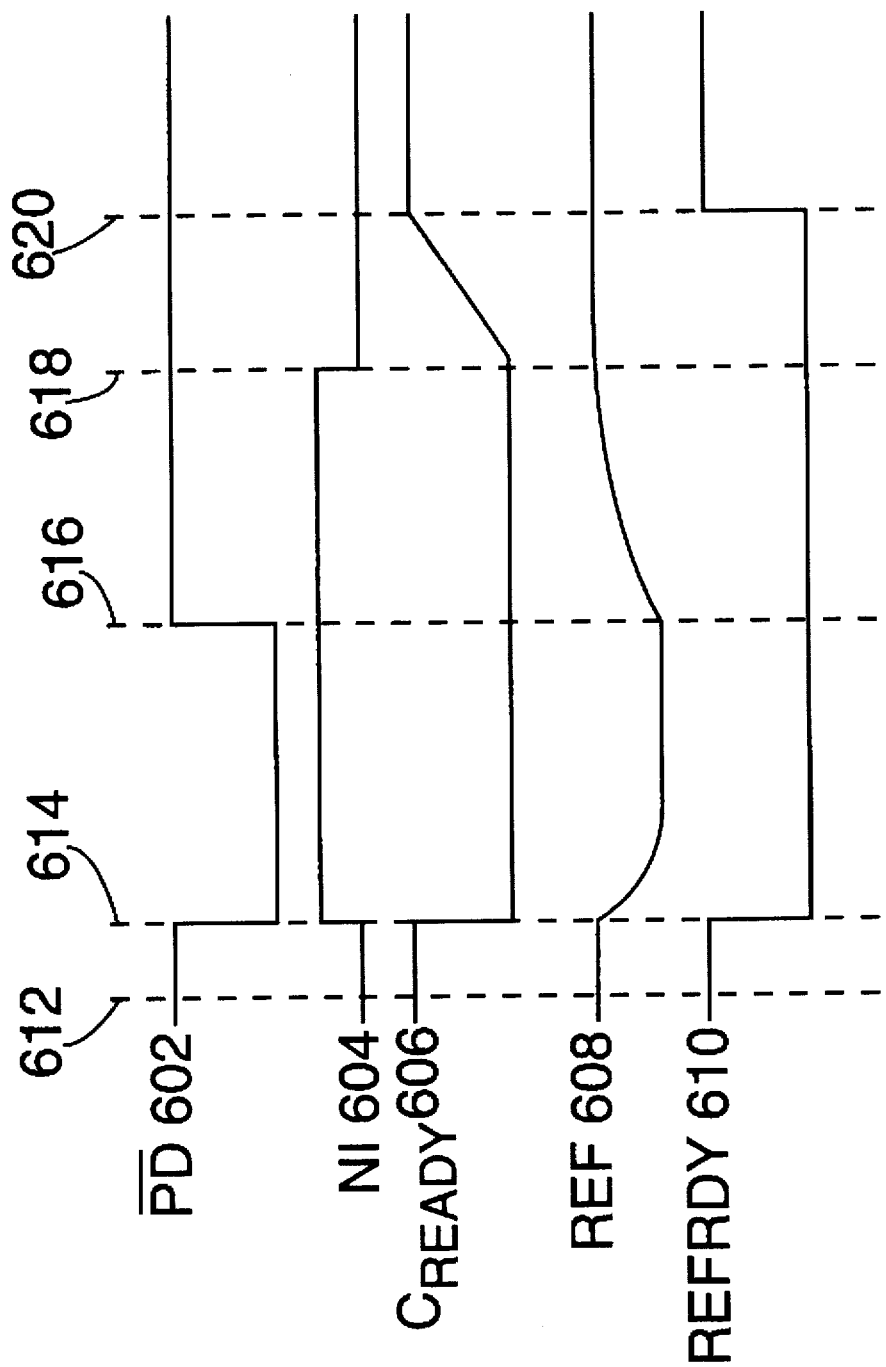
FIG. 6 is a graph showing the REFRDY signal and several related signals, all with respect to time and in accordance with the principles of the present invention.

FIG. 6 is a graph showing the timing of various signals during the generation of the REFRDY signal by voltage reference subblock 204 of FIGS. 2 and 5. The graph may be relevant to understanding the operation of the circuitry shown in FIG. 5. Voltage reference subblock 204 of FIGS. 2 and 5 is only powered down during SLEEP mode or total shutdown (because of the time required for power-up). Therefore, signal $\overline{PD}$ 602 is the same as the inverted SLEEP signal (SLEEP) shown in FIG. 3. Signal N1 604 corresponds to the node voltage at node 526 in FIG. 5. Signal $C_{READY}$ 606 corresponds to the voltage across capacitor $C_{READY}$ in FIG. 5. Signal REF 608 corresponds to the output voltage of the voltage reference generator circuit (REF in FIG. 5). Signal REFRDY 610 is the digital signal indicating that the reference voltage generator has sufficiently stabilized for the ADC to adequately perform analog-to-digital conversion (REFRDY of FIG. 5).

Under steady state conditions as at time 612, $\overline{PD}$ 602 is high, N1 604 is low, and $C_{READY}$ 606 is fully charged. REF 608 is stable at the reference voltage, and REFRDY 610 is high.

The ADC enters SLEEP mode when $\overline{PD}$ 602 goes low, such as at time 614. When $\overline{PD}$ 602 goes low, N1 604 immediately goes high, $C_{READY}$ 606 immediately goes to GND, and REF 608 slowly drops to GND. REFRDY 610 goes low immediately after $C_{READY}$ 606 goes low.

The ADC exits SLEEP mode and powers up when $\overline{PD}$ 602 goes high, as shown at time 616. REF 608 immediately begins its slow climb back up to the proper reference voltage. At time 618, REF 608 has risen sufficiently to force N1 604 to go low. N1 604 going low triggers capacitor $C_{READY}$ to begin charging back up, as shown as shown by $C_{READY}$ 606. At time 620, $C_{READY}$ 606 shows that capacitor $C_{READY}$ is almost fully charged, which triggers REFRDY 610 to go high to indicate that the ADC may adequately perform analog-to-digital conversions.

Figure 7:
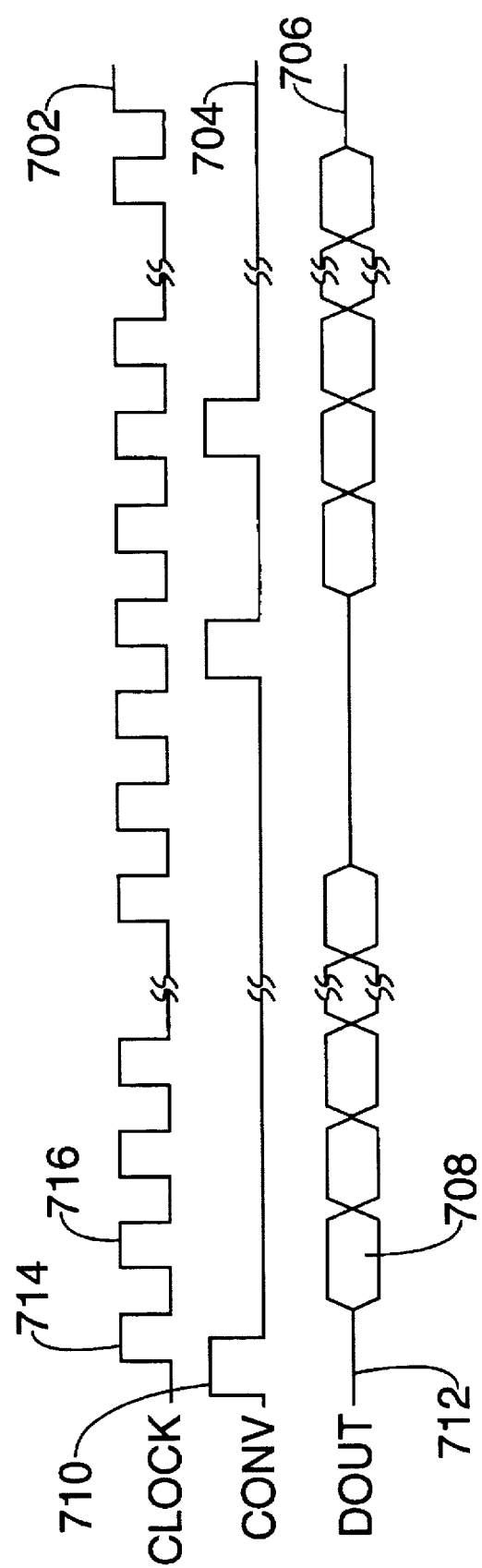
FIG. 7 is a graph showing an ADC in accordance with the principles of the present invention outputting data, with respect to time.

The REFRDY signal may be output as part of the DOUT serial digital data bitstream. As previously shown in FIG. 1, typical serial ADCs output a dummy bit 112 before the serial digital data bitstream from the analog-to-digital conversion operation. FIG. 7 is a graph showing CLOCK 702, CONV 704, and DOUT 706 signals for an ADC in accordance with the principles of the present invention. The dummy bit 112 of FIG. 1 is replaced with the REFRDY bit 708. Thus, the ready condition of the ADC can be indicated to the user without any additional pins or any additional throughput delay on the serial port. If the REFRDY bit is low, the ADC has not yet sufficiently stabilized to adequately perform the conversion operation.

Outputting the REFRDY bit through DOUT may be implemented in a successive approximation ADC as follows: Upon powering up, the REFRDY circuitry in voltage reference subblock 204 of FIG. 2 checks the REFRDY state. REFRDY is then continuously output to the first register of N+1 registers in logic subblock 208 of FIG. 2. (An output word having N bits would require a total of N+1 registers—N data bits+1 REFRDY bit.)

As shown in FIG. 7, the conversion operation begins after CONV pulse 710 occurs while the conversion circuit is in a wait state indicated by signal 712 on trace DOUT 706. At the downward edge of the first CLOCK pulse 714, the switch corresponding to the first register in logic subblock 208 of FIG. 2 is switched to output. The remaining switches are left open. REFRDY is piped out on trace DOUT 706 as shown by REFRDY bit 708. In addition, the most significant bit of N bits is produced and loaded in the second register of N+1 registers in logic subblock 208 of FIG. 2. At the downward edge of the second CLOCK pulse 716, the switch corresponding to the second register in logic subblock 208 of FIG. 2 is switched to output and the switch corresponding to the first register is left open. The most significant bit of N bits is piped out on trace DOUT 706. The second most significant bit of N bits is produced and loaded in the third register in logic subblock 208 of FIG. 2. This continues for a total of N+1 clock pulses to produce a total of N+1 bits output through DOUT 706 (N data bits+1 REFRDY bit).

The REFRDY output signal may also, of course, be sent to an additional, dedicated output pin to give a constant indication of the ready condition of the ADC.

It will be understood that the foregoing is only illustrative of the principles of the invention, and that various modifications can be made by those skilled in the art without departing from the scope and spirit of the invention. Thus, the present invention is only limited by the claims which follow.

What is claimed is:

1. A converter circuit for converting an analog input signal into a serial digital output signal in response to a plurality of control signals, the serial digital output signal comprising a plurality of bits and corresponding to the value of the analog input signal, the converter circuit comprising:
 a signal generating circuit for converting the analog input signal into the corresponding serial digital output signal in response to the plurality of control signals, the signal generating circuit comprising a plurality of components;
 power control circuit for selectively applying and shutting off current to components selected from the plurality of components of the signal generating circuit; and
 decoder circuit for generating a plurality of command signals in response to the plurality of control signals, the plurality of control signals only including signals which are required by the signal generating circuit, the plurality of command signals controlling the power control circuit.

2. The converter circuit defined in claim 1, wherein the plurality of control signals comprise a circuit timing signal and a signal initiating the converting of an analog input signal into a serial digital output signal.

3. The converter circuit defined in claim 1, wherein the power control circuit is capable of selectively shutting off current to selected components of the plurality of components of the signal generating circuit in a first mode, shutting off current to all components of the plurality of components of the signal generating circuit in a second mode, and applying current to all components of the plurality of components of the signal generating circuit in a third mode.

4. The converter circuit defined in claim 3, wherein the plurality of control signals comprise a circuit timing signal and a signal initiating the converting of an analog input signal into a serial digital output signal.

5. The converter circuit defined in claim 3, wherein the selected components in the first mode correspond to components which are activated essentially instantaneously on command.

6. The converter circuit defined in claim 3, wherein the signal generating circuit only operates in the third mode and is only operated after a signal has been produced indicating that support circuitry is operationally stable and ready to support conversion operations by the signal generating circuit.

7. The converter circuit defined in claim 1, wherein the decoder circuit comprises a plurality of flip-flops coupled together in series and the plurality of command signals are generated from selected outputs of the plurality of flip-flops.

8. The converter circuit of claim 1, wherein the converter circuit is a stand-alone integrated circuit having at most input pins adapted to receive input signals for the signal generation circuit and an output pin for outputting the digital output signal.

9. The converter circuit of claim 1, wherein the converter circuit is a circuit embedded within an integrated circuit, the converter circuit having at most input lines adapted to receive input signals for the signal generation circuit from the integrated circuit and an output line for outputting the digital output signal.

10. The converter circuit of claim 9, wherein the integrated circuit is adapted to receive a ready signal indicating that support circuitry is operationally stable and ready to support conversion operations, and the integrated circuit only signals the signal generating circuit to perform conversion operations after receiving the ready signal.

11. A converter circuit for converting an analog input signal into a corresponding serial digital output signal, the serial digital output signal comprising a plurality of bits and corresponding to the value of the analog input signal, the circuit comprising:
 a voltage reference circuit which provides a constant reference voltage at an output and which can be selectively powered down upon receipt of a power down signal;
 a voltage reference ready decoder circuit which generates a ready signal indicating that the output of the voltage reference circuit is stable at the constant reference voltage;
 a signal generating circuit coupled to the voltage reference circuit, the signal generating circuit converting the analog input signal into the corresponding serial digital output signal; and
 a signal processing circuit for providing the ready signal to external circuitry.

12. The converter circuit of claim 11, wherein the signal processing circuit inserts the ready signal into the serial digital output signal.

13. The converter circuit of claim 11, wherein the converter circuit is embedded into an integrated circuit which only operates the signal generation circuit if the voltage reference ready decoder circuit generates the ready signal.

14. The converter circuit of claim 11, wherein the decoder circuit comprises:
 a comparator circuit which monitors the output of the voltage reference circuit;
 a capacitor coupled to the comparator circuit, the capacitor providing the ready signal when sufficiently charged; and
 a charging circuit that charges the capacitor in response to signals received from the comparator circuit.

15. The converter circuit of claim 14, wherein the decoder circuit further comprises means for discharging the capacitor when the comparator monitors that the output of the voltage reference circuit has fallen below an acceptable value.

16. The converter circuit of claim 15, wherein the means for discharging comprises a transistor switch having a gate coupled to the comparator circuit and being coupled between the capacitor and ground.

17. The converter circuit of claim 11, wherein the voltage reference circuit comprises:
 a mirror circuit that provides mirrored currents;
 an impedance circuit coupled to the mirror circuit and to the reference circuit output, the impedance circuit having impedances which substantially set the level of the constant reference voltage; and
 an adaptive circuit coupled to the mirror circuit and to the impedance circuit, the adaptive circuit operating to maintain the reference voltage at a substantially constant value in response to changing load conditions at the reference circuit output.

18. The converter circuit of claim 17, wherein the mirror circuit comprises:
 a diode connected transistor coupled to a voltage source at a first potential;
 a first transistor coupled to the voltage source at a first potential and having a gate coupled to the gate of the diode connected transistor;
 a current source coupled to a voltage source at a second potential;
 a second transistor coupled between the diode connected transistor and the current source, the second transistor having a base coupled to the impedance circuit; and a third transistor coupled between the first transistor and the current source and forming a node between the first and third transistors which is coupled to the adaptive circuit, the third transistor having a base coupled to the impedance circuit such that an impedance is coupled between the bases of the second and third transistors.

19. The converter circuit of claim 18, wherein the second potential is ground.

20. The converter circuit of claim 17, wherein the impedance circuit comprises:

a diode-connected transistor coupled to a voltage source at a potential;

a first impedance coupled in series to the transistor and also being coupled to the mirror circuit; and a second impedance coupled in series between the first impedance and the reference circuit output and also being coupled to the mirror circuit.

21. The converter circuit of claim 20, wherein the potential is ground.

22. The converter circuit of claim 17, wherein the adaptive circuit comprises:

first and second transistor having gates coupled to the mirror circuit, the first transistor being coupled between a voltage source and the decoder circuit and also being coupled to a controllable current source, the second transistor being coupled between the voltage source and ground;

a third transistor having a gate coupled to the decoder circuit and to the first transistor, the third transistor being coupled between ground and the second transistor; and a fourth transistor having a gate coupled to a node formed between the second and third transistors, the fourth transistor being coupled between the voltage source and the output of the reference circuit.

23. The converter circuit of claim 22, wherein the fourth transistor is also coupled to a current source which maintains the fourth transistor in the active region of operation.

24. The converter circuit of claim 11, further comprising:

a power control circuit that selectively turns ON and OFF current to components selected from a plurality of circuits comprising the converter circuit; and a decoder circuit for interpreting signal generating circuit signals as commands to enter one of two power down modes.

25. The converter circuit of claim 24, wherein one power down mode corresponds to powering down components which are essentially instantly powered up.

26. The converter circuit of claim 24, wherein one power down mode corresponds to powering down substantially all of the components of the converter circuit which draw current.

27. The converter circuit of claim 26, wherein the other power down mode corresponds to powering down components which are essentially instantly powered up.

28. A method for providing a ready signal indicative of a reference voltage circuit being stable and having an output voltage at a predetermined value, the method comprising the steps of:

providing setpoint circuitry to establish a setpoint for the predetermined value;

providing power down circuitry that allows a power down signal to selectively remove power from the reference voltage circuit;

adjusting the output voltage in response to variations of loading on an output of the reference voltage circuit;

monitoring the output voltage; and turning a ready signal ON and OFF in response to the monitored output voltage.

29. The method of claim 28, wherein the step of turning comprises charging and discharging a capacitor, a substantially fully charged capacitor corresponding to the output voltage being at substantially the setpoint.

30. A converter circuit for converting a signal of a first format into a signal of a second format, the converter circuit comprising:

a signal generating circuit for performing conversion operations based on a set of predetermined inputs;

a power control circuit for selectively turning converter circuit components ON and OFF in response to command signals; and a decoder circuit for decoding the predetermined inputs into command signals, the decoder circuit operating to decode inputs as being from one of the classes of conversion commands and power commands and only including inputs that are required by the signal generating circuit, the decoder circuit operations being transparent to the operation of the signal generating circuit.

31. A converter circuit for converting a signal of a first format into a signal of a second format, the converter circuit comprising:

means for generating a reference voltage at a predetermined level;

means for selectively removing power from the reference voltage generating means;

means for producing a ready signal if the reference voltage is substantially at the predetermined level; and means for adjusting the reference voltage in response to varying load conditions so that the reference voltage is substantially maintained at the predetermined level.

32. A converter circuit for converting a signal of a first format into a signal of a second format, the converter circuit comprising:

means for converting the signal in the first format to the signal in the second format in response to a closed set of inputs that only include inputs required by the means for converting;

means for turning ON and OFF selected components in the converter circuit to selectively reduce power consumption of the converter circuit; and means for decoding the closed set of inputs to determine if the closed set of inputs represents conversion signals, and if not, to interpret the closed set of inputs as power control commands, the power control commands being used to control the means for turning ON and OFF.

33. The converter circuit defined in claim 1, wherein the plurality of control signals are from one of the classes of conversion commands and power commands.

* * * * *